United States Patent
Rayaprolu et al.

(10) Patent No.: US 11,688,479 B2
(45) Date of Patent: Jun. 27, 2023

(54) READ WINDOW BASED ON PROGRAM/ERASE CYCLES

(71) Applicant: Micron Technology, Inc., Boise, ID (US)

(72) Inventors: Vamsi Pavan Rayaprolu, San Jose, CA (US); Giuseppina Puzzilli, Boise, ID (US); Karl D. Schuh, Santa Cruz, CA (US); Jeffrey S. McNeil, Jr., Nampa, ID (US); Kishore K. Muchherla, Fremont, CA (US); Ashutosh Malshe, Fremont, CA (US); Niccolo' Righetti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/453,289

(22) Filed: Nov. 2, 2021

(65) Prior Publication Data
US 2022/0068412 A1    Mar. 3, 2022

Related U.S. Application Data

(63) Continuation of application No. 17/001,745, filed on Aug. 25, 2020, now Pat. No. 11,189,355.

(51) Int. Cl.
G11C 16/14 (2006.01)
G11C 16/34 (2006.01)
G11C 16/32 (2006.01)
G11C 16/26 (2006.01)

(52) U.S. Cl.
CPC .......... *G11C 16/3495* (2013.01); *G11C 16/14* (2013.01); *G11C 16/26* (2013.01); *G11C 16/32* (2013.01)

(58) Field of Classification Search
CPC ..... G11C 16/3495; G11C 16/14; G11C 16/26; G11C 16/32; G11C 16/349
See application file for complete search history.

(56) References Cited

U.S. PATENT DOCUMENTS

| | | | |
|---|---|---|---|
| 7,453,731 B2 | 11/2008 | Tu et al. | |
| 7,593,259 B2 | 9/2009 | Kim | |
| 7,692,970 B2 | 4/2010 | Park et al. | |
| 8,036,044 B2 | 10/2011 | Dong et al. | |
| 8,995,197 B1 | 3/2015 | Steiner | |
| 9,047,955 B2 | 6/2015 | Cometti et al. | |
| 9,164,836 B2 | 10/2015 | Guo et al. | |
| 9,330,784 B2 | 5/2016 | Pangal et al. | |
| 9,514,823 B2 | 12/2016 | Melik-Martirosian | |
| 9,857,992 B2 | 1/2018 | Pangal et al. | |
| 2003/0210573 A1* | 11/2003 | Lee | G11C 16/349 365/185.29 |
| 2007/0253256 A1* | 11/2007 | Aritome | G11C 16/0483 365/185.24 |
| 2013/0080691 A1 | 3/2013 | Weingarten | |
| 2014/0047302 A1 | 2/2014 | Guo et al. | |
| 2015/0113207 A1 | 4/2015 | Shin | |

* cited by examiner

*Primary Examiner* — Xiaochun L Chen
(74) *Attorney, Agent, or Firm* — Brooks, Cameron & Huebsch, PLLC

(57) ABSTRACT

A first group of memory cells of a memory device can be subjected to a particular quantity of program/erase cycles (PECs) in response to a programming operation performed on a second group of memory cells of the memory device. Subsequent to subjecting the first group of memory cells to the particular quantity of PECs, a data retention capability of the first group of memory cells can be assessed.

18 Claims, 6 Drawing Sheets

SUBJECT A FIRST GROUP OF MEMORY CELLS OF A MEMORY DEVICE TO A PARTICULAR QUANTITY OF PECS IN RESPONSE TO A PROGRAMMING OPERATION PERFORMED ON A SECOND GROUP OF MEMORY CELLS OF THE MEMORY DEVICE — 570

ASSESS A DATA RETENTION CAPABILITY OF THE FIRST GROUP OF MEMORY CELLS — 572

READ WINDOW BASED ON PROGRAM/ERASE CYCLES

PRIORITY INFORMATION

This application is a Continuation of U.S. application Ser. No. 17/001,745, filed Aug. 25, 2020, the contents of which are incorporated herein by reference.

TECHNICAL FIELD

Embodiments of the disclosure relate generally to memory systems and more specifically relate to determining a read window based on program/erase cycles.

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
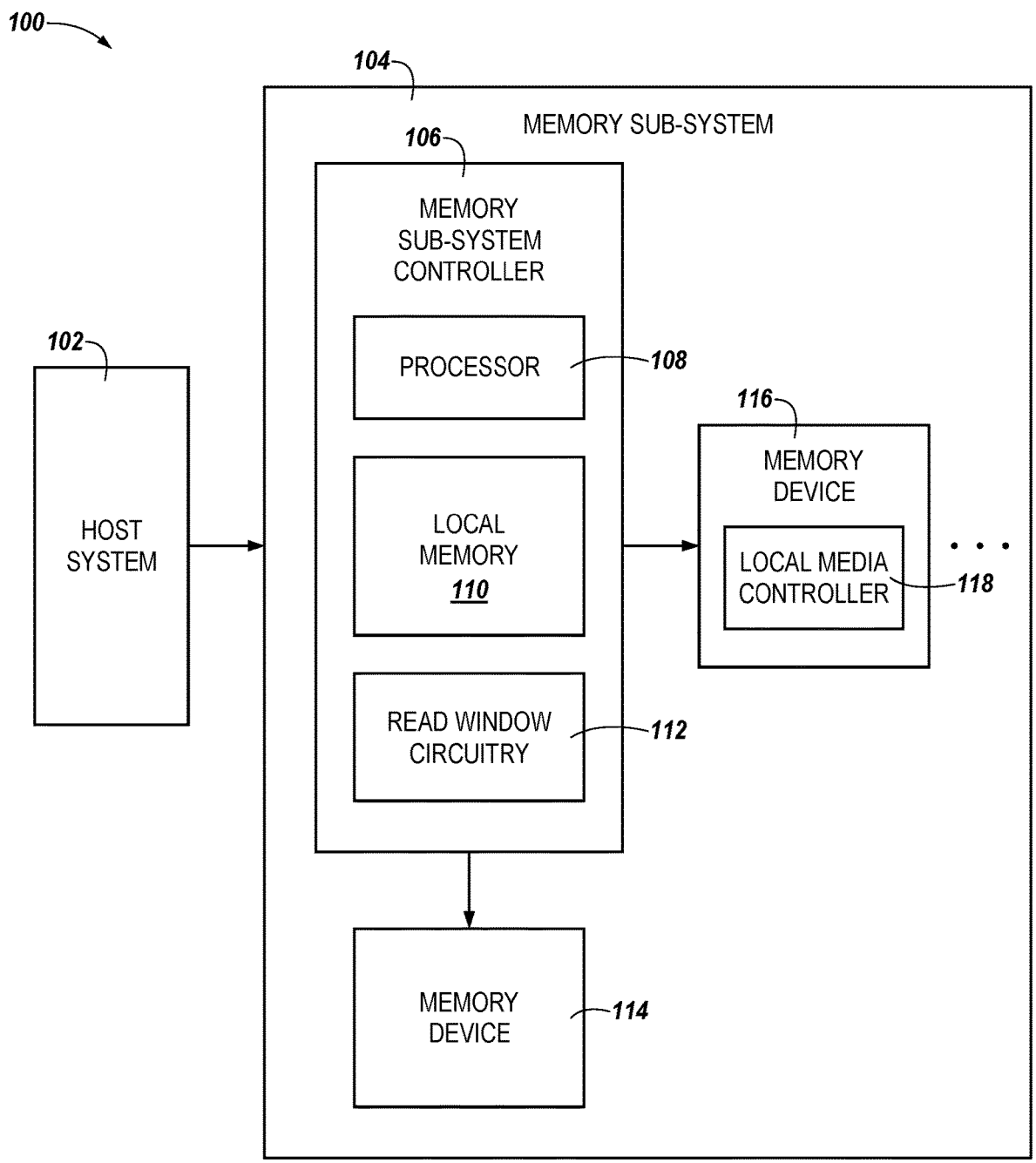
FIG. 1 illustrates an example computing system that includes a memory sub-system in accordance with some embodiments of the present disclosure.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various data states that correlate to the number of bits being stored. Data states can also be referred to as logic states. The data states can be represented by binary values, such as "0" and "1," or combinations of such values. There are various types of cells, such as single level cells (SLCs), multi-level cells (MLCs), triple level cells (TLCs), quad-level cells (QLCs), and penta-level cells (PLCs). For example, a SLC can store one bit of information and has two data states.

Aspects of the present disclosure are directed to determining a read window for a group of memory cells of a memory device based on program/erase cycles (PECs) that a different group of memory cells of the memory device has undergone. A read window can also be referred to as a read window budget (RWB), a threshold voltage ($V_t$) spread, or a valley width. A valley width refers to a difference in magnitude of different program verify voltages for different programmed states or a program verify voltage and an erase verify voltage for different data states. During a service life of a memory device, memory cells of the memory device can undergo an increasing quantity of PECs. As a memory cell undergoes more and more PECs, the data retention capability of the memory cell can decrease.

Some approaches rely on increasing a read window as a memory device undergoes PECs. For example, a read window can be increased by a predetermined amount in response to a memory device undergoing a predetermined, particular amount of PECs. However, such approaches can be generalized and do not consider operating characteristics of individual memory devices and/or operating environments of systems including one or more memory devices.

Aspects of the present disclosure address the above and other deficiencies by subjecting one or more memory cells of a memory device to high quantities of PECs and determining a read window based on subjecting the memory cells to high quantities of PECs. Thus, a read window can be determined and tailored to the operating characteristics of that memory device and/or the operating environment of that memory device within a system. Memory cells can be subjected to PECs that are not associated with a programming operation. The memory cells can be purposefully and intentionally subjected to a quantity of PECs that the memory cells are expected to undergo during a service life of the memory device, or a portion thereof, but in a shorter time span than the service life, or portion thereof. For example, memory cells of a memory device can be subjected to 100,000 PECs in an order of magnitude less time than a service life of the memory device. Trims to be used on memory cells that have undergone a particular quantity of PECs (e.g., 100,000 PECs) during operation of the memory device can be selected and/or modified to provide a read window that provides desired data retention based on subjecting memory cells of the memory cells to the particular quantity of PECs. As used herein, a "trim" or "trim set" generally refers to a set of parameters, such as magnitudes of voltages, differentials, currents, etc. that can be applied to a memory device (via word line and/or bit lines, for example) to operate the memory device (control access to data written to the memory device, for example). Although embodiments of the present disclosure include one or more groups of memory cells is taken away from the storage capacity of a memory device, at least temporarily, the data retention capacity of the memory device is improved by compensating for effects of extensive PECs over the service life of the memory device.

FIG. 1 illustrates an example computing system 100 that includes a memory sub-system 104 in accordance with some embodiments of the present disclosure. The memory sub-system 104 can include media, such as one or more volatile memory devices (e.g., memory device 114), one or more non-volatile memory devices (e.g., memory device 116), or a combination of such.

A memory sub-system 104 can be a storage device, a memory module, or a hybrid of a storage device and memory module. Examples of a storage device include a solid state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), such computing device that includes memory and a processing device.

The computing system 100 includes a host system 102 that is coupled to one or more memory sub-systems 104. In some embodiments, the host system 102 is coupled to different types of memory sub-systems 104. FIG. 1 illustrates one example of a host system 102 coupled to one memory sub-system 104. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. In at least one embodiment, the host system 102 is a computing device that controls a vehicle, such as an autonomous vehicle, and the memory sub-system 104 is an SSD that provides event recorder storage for the vehicle. An event recorder can also be referred to as a "black box" or accident data recorder. The memory sub-system 104 can store time based telemetric sensor data for the vehicle; however, embodiments are not limited to this example.

The host system 102 can include a processor chipset and a software stack executed by the processor chipset. The processor chipset can include one or more cores, one or more caches, a memory controller (e.g., an SSD controller, NVDIMM controller, etc.), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access the non-volatile memory device 116 when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The memory devices 114 and 116 can include any combination of the different types of non-volatile memory devices and/or volatile memory devices. The volatile memory devices (e.g., memory device 114) can be, but are not limited to, random access memory (RAM), such as dynamic random-access memory (DRAM) and synchronous dynamic random access memory (SDRAM).

Some examples of non-volatile memory devices (e.g., memory device 116) include negative-and (NAND) type flash memory and write-in-place memory, such as three-dimensional cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 114 and 116 can include one or more arrays of memory cells. One type of memory cell, for example, single level cells (SLC) can store one bit per cell. Other types of memory cells, such as MLCs, TLCs, QLCs, and PLCs, can store multiple bits per cell. In some embodiments, each of the memory devices 116 can include one or more arrays of memory cells. In some embodiments, a particular memory device can include an SLC portion, and an MLC portion, a TLC portion, a QLC portion, or a PLC portion of memory cells. The memory cells of the memory devices 116 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 106 (or controller 106 for simplicity) can communicate with the non-volatile memory devices 116 to perform operations such as reading data, writing data, erasing data, and other such operations. The memory sub-system controller 106 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processing device 108 (e.g., a processor) configured to execute instructions stored in local memory 110. In the illustrated example, the local memory 110 of the memory sub-system controller 106 is an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc. The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive information or operations from the host system 102 and can convert the information or operations into instructions or appropriate information to achieve the desired access to the non-volatile memory device 116 and/or the volatile memory device 114. The memory sub-system controller 106 can be responsible for other operations such as wear leveling operations, error detection and/or correction operations, encryption operations, caching operations, and address translations between a logical address (e.g., logical block address (LBA)) and a physical address (e.g., physical block address (PBA)) associated with the non-volatile memory device 116. The memory sub-system controller 106 can further include host interface circuitry to communicate with the host system 102 via the physical host interface. The host interface circuitry can convert a query received from the host system 102 into a command to access the non-volatile memory device 116 and/or the volatile memory device 114 as well as convert responses associated with the non-volatile memory device 116 and/or the volatile memory device 114 into information for the host system 102.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be an LBA, which can include or be accompanied by a partition number. The logical address information is the location the host system associates with the host data. The logical address information can be part of metadata for the host data. The LBA can also correspond (e.g., dynamically map) to a physical address, such as a PBA, that indicates the physical location where the host data is stored in memory.

The memory sub-system 104 can also include additional circuitry or components that are not illustrated. In some embodiments, the memory sub-system 104 can include a cache or buffer (e.g., DRAM) and address circuitry (e.g., a row decoder and a column decoder) that can receive an address from the memory sub-system controller 106 and decode the address to access the memory device 114 and/or the memory device 116.

In some embodiments, the memory device 116 includes a local media controller 118 that operates in conjunction with memory sub-system controller 106 to execute operations on one or more memory cells of the non-volatile memory device 116. An external controller (e.g., memory sub-system controller 106) can externally manage the memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND device.

In some embodiments, the memory sub-system controller 118 includes at least a portion of read window circuitry 112. For example, the memory sub-system controller 118 can include the processing device 108 configured to execute instructions stored in local memory 110 for performing the operations described herein. In some embodiments, the read window circuitry 112 is part of the host system 102, an application, or an operating system.

In some embodiments, the read window circuitry 112 can issue, or cause to be issued, a set trim command, which causes the memory device 116 (or portions thereof, such as logical units) to use a particular set of operating parameters to operate the memory cells of the memory device 116. A set trim command can be issued subsequent to subjecting one or more memory cells to a quantity of PECs representative of a service life of the memory device 116 that include operating parameters associated with a read window based on subjecting the memory cells to the representative quantity of PECs. Trims can include operating parameters associated with various operations such as program (write), program verify, erase, erase verify, and sense (read), among other operations associated with memory cells.

Trims can be used to achieve or adjust desired target voltages for programming memory cells, which can create different threshold voltage ($V_t$) distributions for data states. Trims can be used to achieve a read window or adjust a read window between data states (e.g., the voltage spread between different $V_t$ distributions for different data states for memory cells of the memory device 116). Different trims can be used for different operations such as programming, reading, and/or erasing.

Examples of trims include programming voltages, programming frequency, a program start voltage, a program step voltage, a program inhibit start voltage, and an erase verify voltage. The program start voltage is the magnitude of an initial programming voltage pulse of a series of voltage pulses applied to a selected word line during a programming operation performed on memory cells in a selected block. The program step voltage is the voltage step size between programming voltage pulses. The program inhibit start voltage is a voltage used to inhibit further programming of memory cells once the $V_t$ associated with a desired data state has been reached. The erase verify voltage is the voltage used to check whether memory cells in the selected block have a $V_t$ indicative of the erase state.

Other examples of trims include read reference voltages and/or program verify voltages. Program verify voltages represent target voltage levels to which memory cells are to be programmed in order to represent a particular data state. Read reference voltages are voltage levels that can be located between program Vt distributions and used to determine a particular data state of a data cell during a data read operation. As used herein, trims are distinguished from programming times.

The read window circuitry 112 can be configured to subject a group of memory cells to a quantity of PECs representative of PECs that the group of memory cells would undergo during a service life of the memory device 116, or a portion thereof. A group of memory cells can be a physical block of memory cells. The read window circuitry 112 can be configured to cause a group of memory cells of the memory device to be subjected to PECs. The quantity of PECs is proportional to a quantity of programming operations undergone by a different group of memory cells of the memory device. The PECs, to which the group of memory cells are subjected, are not associated with data storage. Upon completion of subjecting the group of memory cells to the PECs, the group of memory cells can be released for data storage. The read window circuitry 112 can be configured to, subsequent to subjecting the group of memory cells to the PECs, to cause a storage charge loss (SCL) and an intrinsic charge loss (ICL) of the group of memory cells to be determined. The SCL and ICL can be determined at least an hour after (e.g., 10 hours) subjecting the group of memory cells to the PECs is complete. This allows effects from subjecting the group of memory cells to a high quantity of PECs in a relatively short amount of time. The read window circuitry 112 can be configured to cause a read window for subsequent programming operations performed on the different group of memory cells to be adjusted based on the determined SCL and ICL. A linear slope can be extrapolated from an initial SCL and ICL (measured before the PECs) to determine an initial read window to provide a desired data retention capability after the PECs and/or during a service life of a memory device. A non-limiting examples of extrapolation techniques include R-squared, linear regression, spline extrapolation, two-point extrapolation, and three-point extrapolation. A target voltage corresponding to a data state can be adjusted to adjust the read window.

In some embodiments, the read window circuitry 112 can be configured to cause extrapolation of a rate of change of a read window of the group of memory cells with respect to the plurality of PECs. The read window circuitry 112 can be configured to cause a programming operation to be performed on another group of memory cells using the adjusted read window.

The read window circuitry 112 can execute instructions to utilize trims on groups of memory cells where the trims provide a desired read window. For example, the read window circuitry 112 can execute instructions to adjust a read window in response to memory cells of the memory device 116 undergoing a particular quantity of PECs.

Figure 2:
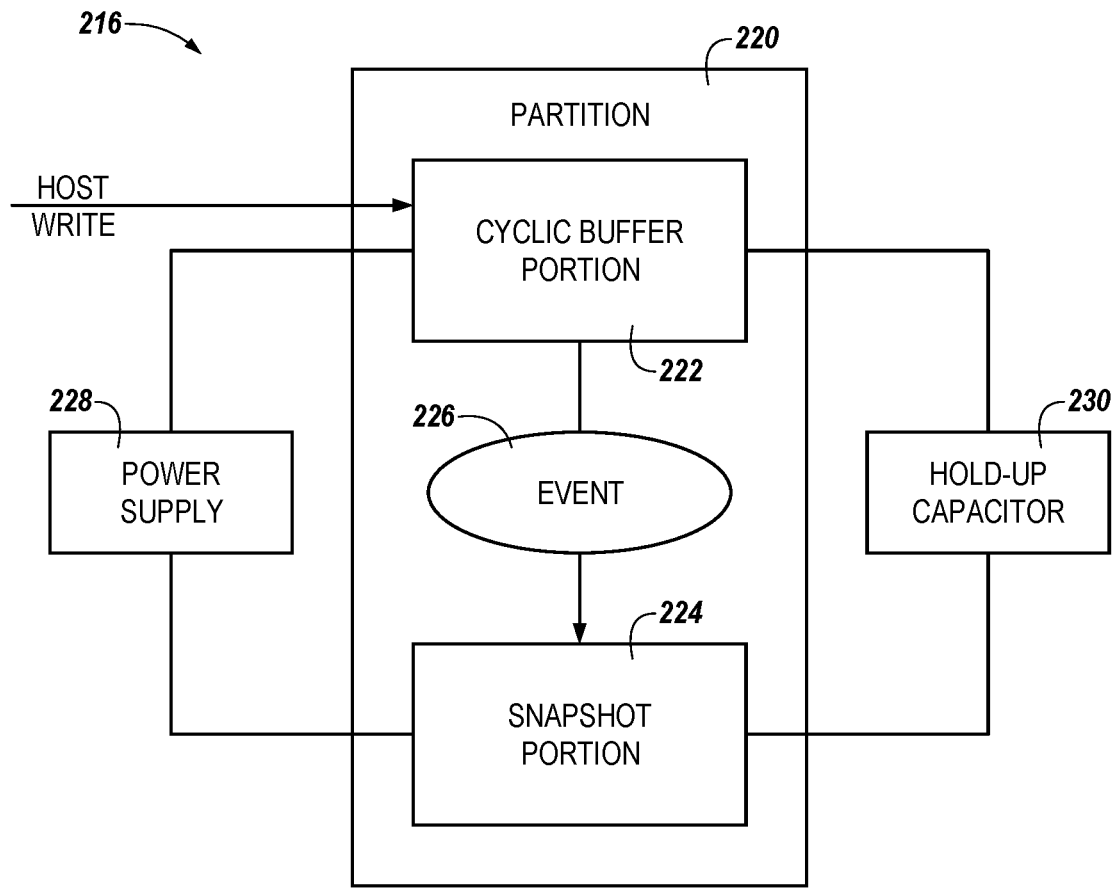
FIG. 2 illustrates an example of a partition including a cyclic buffer portion and a snapshot portion within a memory device in accordance with some embodiments of the present disclosure.

In some embodiments, the memory device 116 can include a cyclic buffer portion (e.g., the cyclic buffer portion 222 illustrated by FIG. 2) and a snapshot portion (e.g., the snapshot portion 224 illustrated by FIG. 2).

FIG. 2 illustrates an example of a partition 220 including a cyclic buffer portion 222 and a snapshot portion 224 within a memory device 216 in accordance with some embodiments of the present disclosure. The cyclic buffer portion 222 and snapshot portion 224 can be reserved portions of the partition 220. Host data can be received by the memory sub-system. The host data can be time based telemetric sensor data from different sensors of a vehicle. The time based telemetric sensor data from the different sensors can be aggregated by the host and sent to the memory sub-system at a data rate. The host data can be received by the memory sub-system and stored in the cyclic buffer portion 222 of the non-volatile memory device 216. As the cyclic buffer portion 222 is filled with host data, new data received from the host is stored sequentially, but older data in the cyclic buffer portion 222 can be erased or overwritten. The cyclic buffer portion 222 can therefore operate as a first-in-first-out (FIFO) buffer, where newly received data replaced the oldest data therein.

The cyclic buffer portion 222 can be coupled to the snapshot portion 224. Upon occurrence of a trigger event 226, an amount of the time based telemetric sensor data from the cyclic buffer portion 222 can be copied to the snapshot portion 224. The recorded telemetric sensor data corresponding to the predetermined playback time can be referred to as a "snapshot". The amount of host data corresponding to a defined period of time, which may be referred to as a playback time (e.g., 30 seconds), is referred to as a snapshot size whereas the data itself over that defined period of time is referred to as a snapshot. The snapshot size can be predefined for a period of time immediately preceding a trigger event. The snapshot size and/or playback time can be a predefined value programmed to the memory sub-system by a manufacturer, supplier, or user of the memory sub-system. In some embodiments, the determination that the trigger event 226 has occurred can include actuation of a trigger signal based at least in part upon received sensor information from a host that is above a threshold, such as a quantitative value.

The cyclic buffer portion 222 can store significantly more data over the service life of the memory device 216 than the snapshot portion 224. For example, the cyclic buffer portion 222 can store 3-4 orders of magnitude (1,000-10,000 times) more data than the snapshot portion 224. However, the cyclic buffer portion 222 does not have a greater storage capacity than the snapshot portion 224. Rather, the size (amount of memory) of the snapshot portion 224 can be based on the rate at which data is to be received from the host, a playback time, and a quantity of snapshots that are desired to be available in the snapshot portion 224. The snapshot portion 224 can have sufficient storage to save [data rate from host (e.g., in GB/sec)*playback time (e.g., in sec)*desired quantity of snapshots (e.g., a whole number)]. In other words, the size of the snapshot portion 224 can be sufficiently large to store a desired number of snapshots. As used herein, the size of the snapshot portion 224 is referred to as "a user capacity" of the memory sub-system.

The memory sub-system can be configured to operate the snapshot portion 224 such that memory cells of the snapshot portion 224 are programmed to a $V_t$ based on a remaining service life of the memory sub-system. It is desirable for the snapshot portion 224 to store data accurately and reliably because the snapshots are intended to be recoverable after a trigger event. Thus, a performance target of the snapshot portion 224 can be data retention.

The copying of a snapshot from the cyclic buffer portion 222 to the snapshot portion 224 can be powered by a power supply 228 of the memory sub-system under normal circumstances. However, copying of the snapshot from the cyclic buffer portion 222 to the snapshot portion 224 can be powered by a backup power supply, such as one or more hold-up capacitors 230 in response to a loss of system power (e.g., the power supply 228), which can be associated with the trigger event 226, such as a vehicle accident. In at least one embodiment, the loss of power from the power supply 228 can be the trigger event 226. A size and/or quantity of the hold-up capacitor(s) 230 are sufficient to provide enough power to copy one snapshot from the cyclic buffer portion 222 to the snapshot portion 224. As illustrated, the power supply 228 and the hold-up capacitor 230 are coupled to the cyclic buffer portion 222 and the snapshot portion 224. This indicates that the power supply 228 and the hold-up capacitor 230 are coupled to the memory device 216 to provide power therefor. There may not be a direct physical connection between either the power supply 228 or the hold-up capacitor 230 and the partition 220, but the power can be provided through write circuitry (not specifically illustrated).

In some embodiments, memory cells of the cyclic buffer portion 222 can be operated so as to store one bit per cell (SLC mode) and memory cells of the snapshot portion 224 can be operated so as to store more than one bit per cell. It can take longer to operate memory cells that store more than one bit per cell than to operate memory cells that store only one bit per cell. For example, an increased number of data states represented by the memory cells having multiple bits per cell can further increase complexity of an algorithm associated with programming, reading, and/or erasing the memory cells. Therefore, the memory cells programmed to store multiple bits per cell can have a different programming characteristic, such as a slower data transfer rate and/or longer programming time (e.g., time elapsed to program data to the memory cells), than that of the SLC memory cells and/or memory cells programmed to store fewer bits per cell. Memory cells of the cyclic buffer portion 222 can be operated with a faster programming time than a programming time for the memory cells of the snapshot portion 224.

Figure 3:
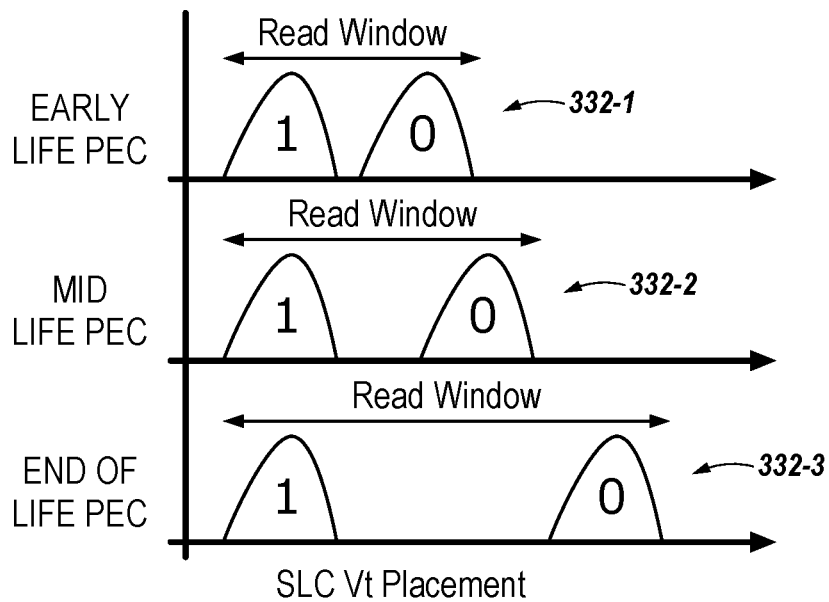
FIG. 3 illustrates different read windows in accordance with some embodiments of the present disclosure.

FIG. 3 illustrates different read windows 332-1, 332-2, and 332-3 in accordance with some embodiments of the present disclosure. The horizontal axis represents the charge or voltage of the memory cell ($V_t$) and the vertical axis represents the quantity of memory cells for each data state (1 and 0) that are programmed to a particular voltage. The curves for each data state (1 and 0) therefore represent statistical distributions of memory cell threshold voltages for each data state. The read windows 332-1, 332-2, and 332-3 are the respective separation between the $V_t$ distributions along the horizontal axis (e.g., in volts).

Memory cells of a non-volatile memory device can be in good condition early in the service life of the non-volatile memory device. Because the memory cells are in good condition, large valley margins are not required. Thus, the non-volatile memory device can utilize a narrow read window, such as the read window 332-1, without negatively affecting the reliability of the non-volatile memory device. Utilizing a narrow read window can slow down degradation of memory cells of the non-volatile memory device, which, in turn, can increase the endurance and data retention performance of the non-volatile memory device.

FIG. 3 provides a graphical representation of programming a group of memory cells of a non-volatile memory device to a $V_t$ based on a quantity of PECs that the group of memory cells has undergone. For example, early in the service life of the non-volatile memory device, memory cells of the non-volatile memory device can be programmed using trims resulting in the read window 332-1. The read window 332-1 is narrow such that the $V_t$ distribution associated with a data state (e.g., an erased state (1)) is close to the $V_t$ distribution associated with a different data state (e.g., a programmed state (0)). A narrower $V_t$ spread between data states can reduce the data reliability because it can be more difficult to distinguish between the data states. But because the memory cells are in good condition early in the service life of the non-volatile memory device, data states of the memory cells can still be distinguished between even when the read window 332-1 is used.

A benefit of using a narrow read window, such as the read window 320-1, early in the service life of the non-volatile memory device can be reducing memory cell degradation early in the service life of the non-volatile memory device instead of using a wide read window, such as the read window 332-3, throughout the service life of the non-volatile memory device. Programming a memory cell to a greater $V_t$ (and subsequently erasing the memory cell) over many cycles can degrade the memory cell at a faster rate than programming the memory to a lower $V_t$ (and subsequently erasing the memory) early in the service life of the non-volatile memory device and increasing the $V_t$ throughout the service life of the non-volatile memory device in accordance with some embodiments of the present disclosure. Furthermore, although operation of an SLC is generally illustrated in FIG. 3, embodiments are not so limited. The same principles can be applied to memory cells that are operated with more than one programmed state.

As illustrated by FIG. 3, some embodiments of the present disclosure include increasing the $V_t$ corresponding to the data state 0 as the non-volatile memory device undergoes more PEC. Programming the memory cells to a greater $V_t$ requires a greater voltage and/or increased number of voltage pulses to be applied to the memory cells, which can degrade the materials of the memory cells. During the middle of the service life of the non-volatile memory device, memory cells of the non-volatile memory device can be programmed to a greater $V_t$ corresponding to a desired data state. In response to the non-volatile memory undergoing further PEC, memory cells of the non-volatile memory device can be programmed to a greater $V_t$ corresponding to the data state 0 as illustrated by the read window 332-2. During the latter portion of the service life of the non-volatile memory device, memory cells of the non-volatile memory device can be programmed to an even greater $V_t$ corresponding to a desired data state. In response to the non-volatile memory undergoing even further PEC, memory cells of the non-volatile memory device can be programmed to an even greater $V_t$ corresponding to the data state 0 as illustrated by the read window 332-3. Increasing the read window based on the quantity of PEC that the memory device, block, or cell has undergone (for example, from the read window 332-1 to the read window 332-2 and/or the read window 332-3) in accordance with some embodiments of the present disclosure can be beneficial to improve data retention of the memory device. Although FIG. 3 illustrates three different read windows 332-1, 432-2, and 432-3, embodiments of the present disclosure are not so limited.

Figure 4:
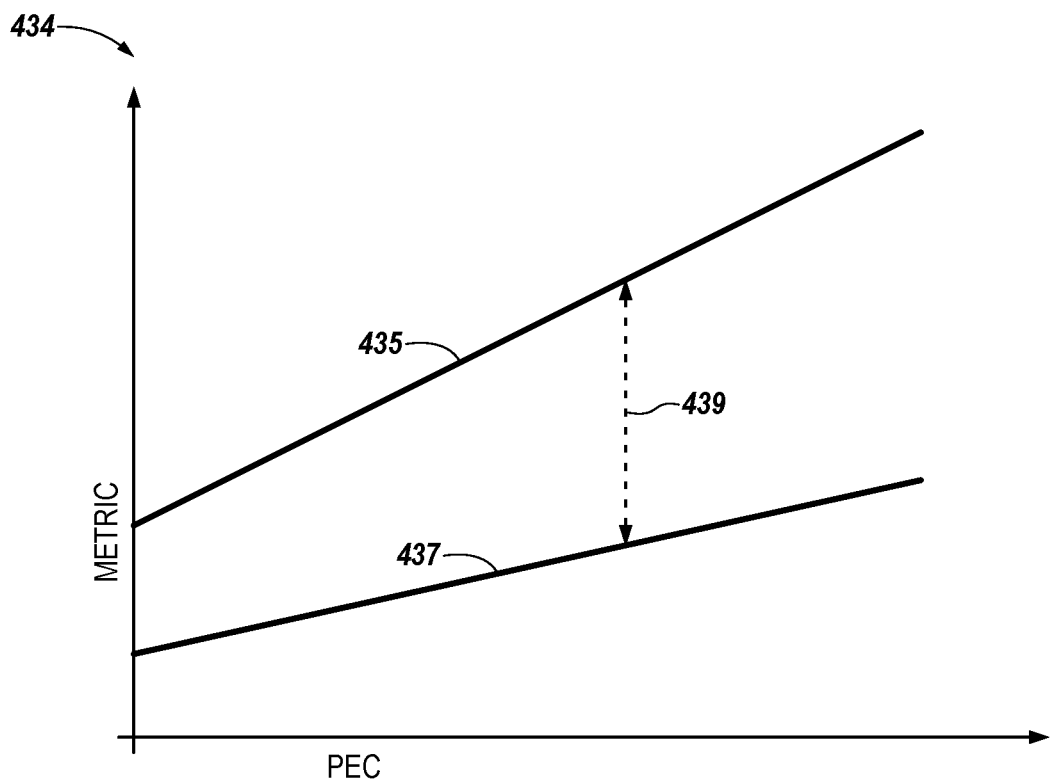
FIG. 4 is a plot demonstrating adjusting a read window in accordance with some embodiments of the present disclosure.

FIG. 4 is a plot 434 demonstrating adjusting a read window in accordance with some embodiments of the present disclosure. The horizontal axis of plot 434 indicates a quantity of PEC with the quantity of PEC increasing toward the right side of the plot 434. The vertical axis of the plot 434 represents voltages.

Line 435 represents program verify voltages. A program verify voltage is used to confirm that a memory cell has been programmed to at least a $V_t$ corresponding to a programmed state. A magnitude of a program verify voltage can be less than a target voltage corresponding to the programmed state. A magnitude of a program verify voltage corresponds to the lesser side of a $V_t$ distribution.

Line 437 represents an erase verify voltage. An erase verify voltage is used to confirm that a memory cell has been erased to at least $V_t$ corresponding to an erased state. A magnitude of an erase verify voltage can be greater than a target voltage corresponding to the programmed state. A magnitude of an erase verify voltage corresponds to the greater side of a $V_t$ distribution.

The line 439 represents a read window. A read window for a particular quantity of PECs can be defined by a program verify voltage indicated by the line 435 and an erase verify voltage indicated by the line 437.

In some embodiments, a read window can be adjusted by increasing a magnitude of a program verify voltage. For example, the memory cell can undergo a quantity of program voltage pulses and subsequently a program verify voltage can be applied to the memory cell to confirm that the memory cell has sufficiently programmed. If the memory cell conducts as a result of application of the program verify voltage, then the memory cell passes. If the memory cell does not conduct as a result of application of the program verify voltage, then one or more additional program voltage pulses can be applied to the memory cell.

In some embodiments, a read window, by increasing a magnitude of an erase verify voltage. Increasing a magnitude of an erase verify voltage can effectively relax the program verify voltage requirement discussed above. Increasing a magnitude of the erase verify voltage can cause the memory cell to be erased so shallow (to a low or negative voltage) that it is easier for the memory cell to be considered to be erased. As the memory cell ages, it can become difficult to erase the memory cell to such low or negative voltages due to degradation of the memory cell.

Figure 5:
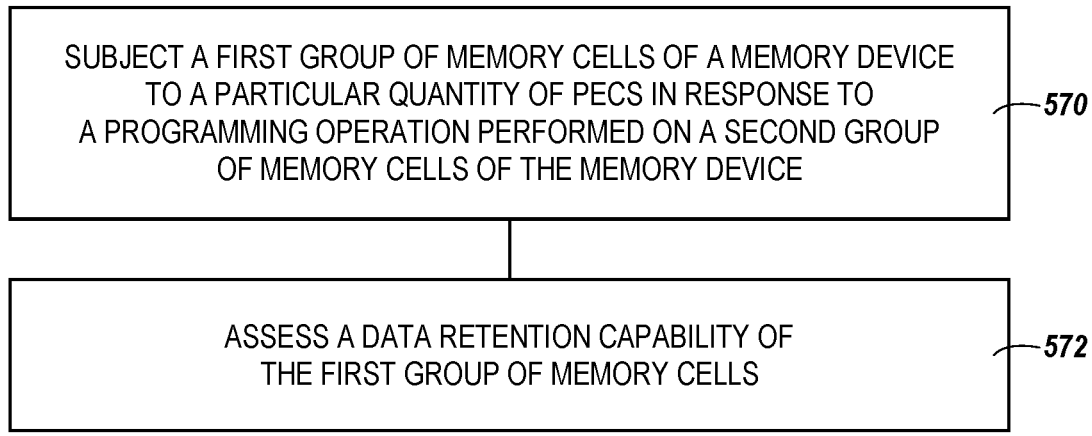
FIG. 5 is a flow diagram of an example method for determining a read window in accordance with some embodiments of the present disclosure.

FIG. 5 is a flow diagram of an example method for determining a read window in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, read window circuitry 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 570, a group of memory cells of a memory device can be subjected to a particular quantity of PECs in response to a programming operation performed on a different group of memory cells of the memory device. For instance, in response to a programming operation being performed on a block or a superblock of a memory device, another block can be subjected to a quantity of PECs that is the particular quantity of PECs. The particular quantity of PECs can be a multiple of the PECs undergone by the block or superblock during the programming operation.

At operation 572, subsequent to subjecting the group of memory cells to the particular quantity of PECs, a data retention capability of the group of memory cells can be assessed. For example, a SCL and/or an ICL of the group of memory cells can be determined. Assessing the data retention capability of a group of memory cells can include determining a read window of the group of memory cells.

Although not specifically illustrated by FIG. 5, an initial read window for another group of memory cells of the memory device can be determined based on the determined read window to achieve a desired data retention capability after the other group of memory cells has undergone the particular quantity of PECs. A program operation can be performed on the other group of memory cells using the initial read window. Although not specifically illustrated by FIG. 5, an initial read window for another group of memory cells of the memory device based on the determined read window to achieve a desired data retention capability at a particular point of a service life of the memory device.

Although not specifically illustrated by FIG. 5, subsequent to assessing the data retention capability of the group of memory cells, the first group of memory cells can be subjected to the particular quantity of PECs again. Subsequently, the data retention capability of the first group of memory cells can be assessed again. For example, a SCL and/or an ICL, and/or a read window of the group of memory cells can be determined again.

Figure 6:
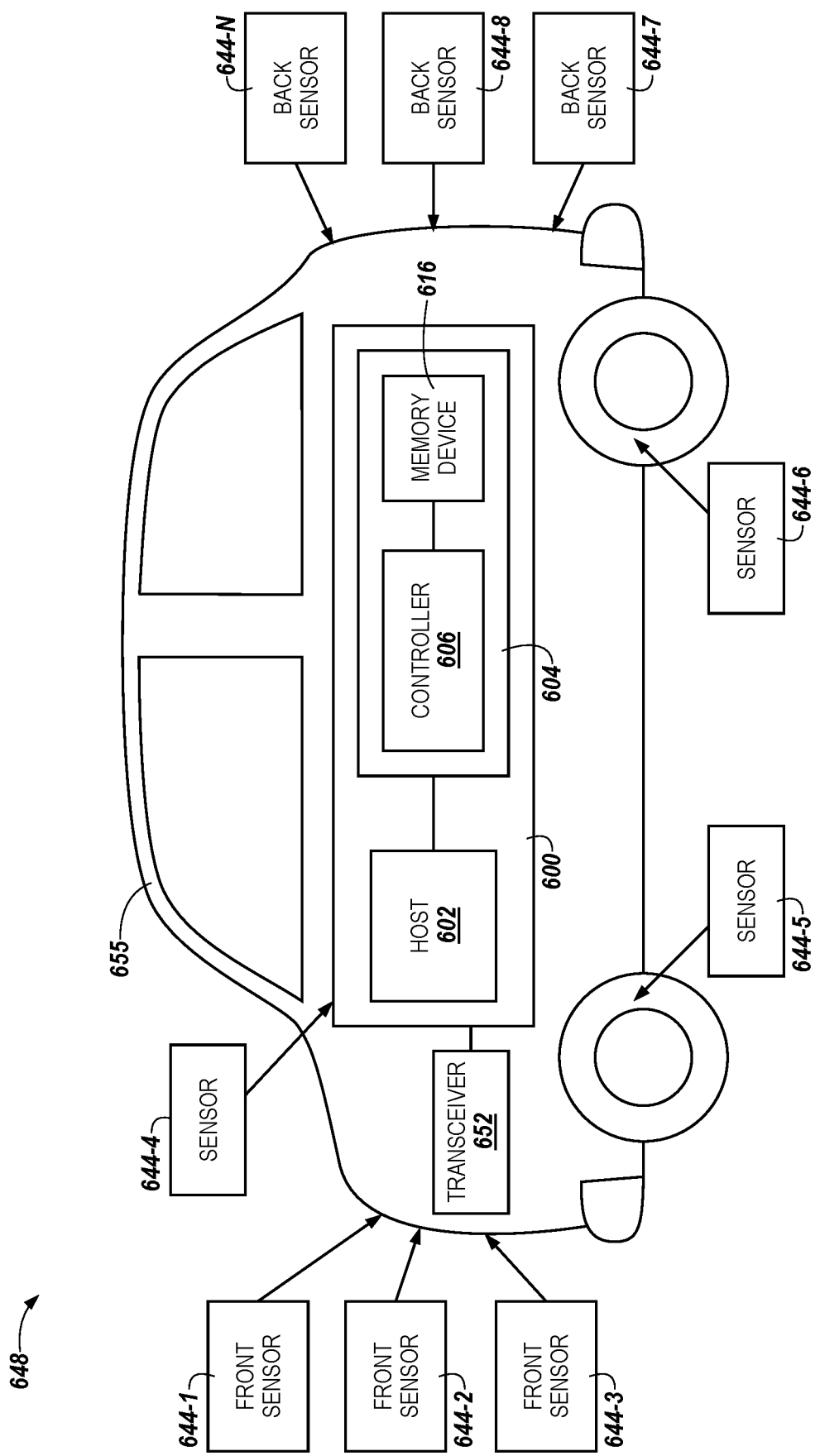
FIG. 6 illustrates an example of a system including a computing system in a vehicle in accordance with some embodiments of the present disclosure.

FIG. 6 illustrates an example of a system 848 including a computing system 600 in a vehicle 655 in accordance with some embodiments of the present disclosure. The computing system 600 can include a memory sub-system 604, which is illustrated as including a controller 606 and non-volatile memory device 616 for simplicity but is analogous to the memory sub-system 104 illustrated in FIG. 1. The computing system 600, and thus the host 602, can be coupled to one or more sensors 644-1, 644-2, 644-3, 644-4, 644-5, 644-6, 644-7, 644-8, . . . , 644-N either directly, as illustrated for the sensor 644-4 or via a transceiver 652 as illustrated for the sensors 644-1, 644-2, and 644-3. The transceiver 652 is able to receive time based telemetric sensor data from the sensors 644 wirelessly, such as by radio frequency communication. In at least one embodiment, each of the sensors 644 can communicate with the computing system 600 wirelessly via the transceiver 652. In at least one embodiment, each of the sensors 652 is connected directly to the computing system 600 (e.g., via wires or optical cables). As used herein, telemetric sensor data means that the data is collected by the sensors 652 that are remote from the memory sub-system 604 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 655 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 644 are illustrated in FIG. 6 as including example attributes. For example, the sensors 644-1, 644-2, and 644-3 are camera sensors collecting data from the front of the vehicle 655. The sensors 644-4, 644-5, and 644-8 are microphone sensors collecting data from the from the front, middle, and back of the vehicle 655. The sensors 644-7, 644-8, and 644-N are camera sensors collecting data from the back of the vehicle 655. As another example, the sensors 644-5 and 644-6 are tire pressure sensors. As another example, the sensor 644-4 is a navigation sensor, such as a global positioning system (GPS) receiver. As another example, the sensor 644-6 is a speedometer. As another example, the sensor 644-4 represents one or more engine sensors such as a temperature sensor, a pressure sensor, a voltmeter, an ammeter, a tachometer, a fuel gauge, etc. As another example, the sensor 644-4 represents a video camera.

The host 602 can execute instructions to provide an overall control system and/or operating system for the vehicle 655. The host 602 can be a controller designed to assist in automation endeavors of the vehicle 655. For example, the host 602 can be an advanced driver assistance system controller (ADAS). An ADAS can monitor data to prevent accidents and provide warning of potentially unsafe situations. For example, the ADAS can monitor sensors in the vehicle 655 and take control of the vehicle 655 operations to avoid accident or injury (e.g., to avoid accidents in the case of an incapacitated user of a vehicle). The host 602 may need to act and make decisions quickly to avoid accidents. The memory sub-system 604 can store reference data in the non-volatile memory device 616 such that time based telemetric sensor data from the sensors 644 can be compared to the reference data by the host 602 in order to make quick decisions.

Figure 7:
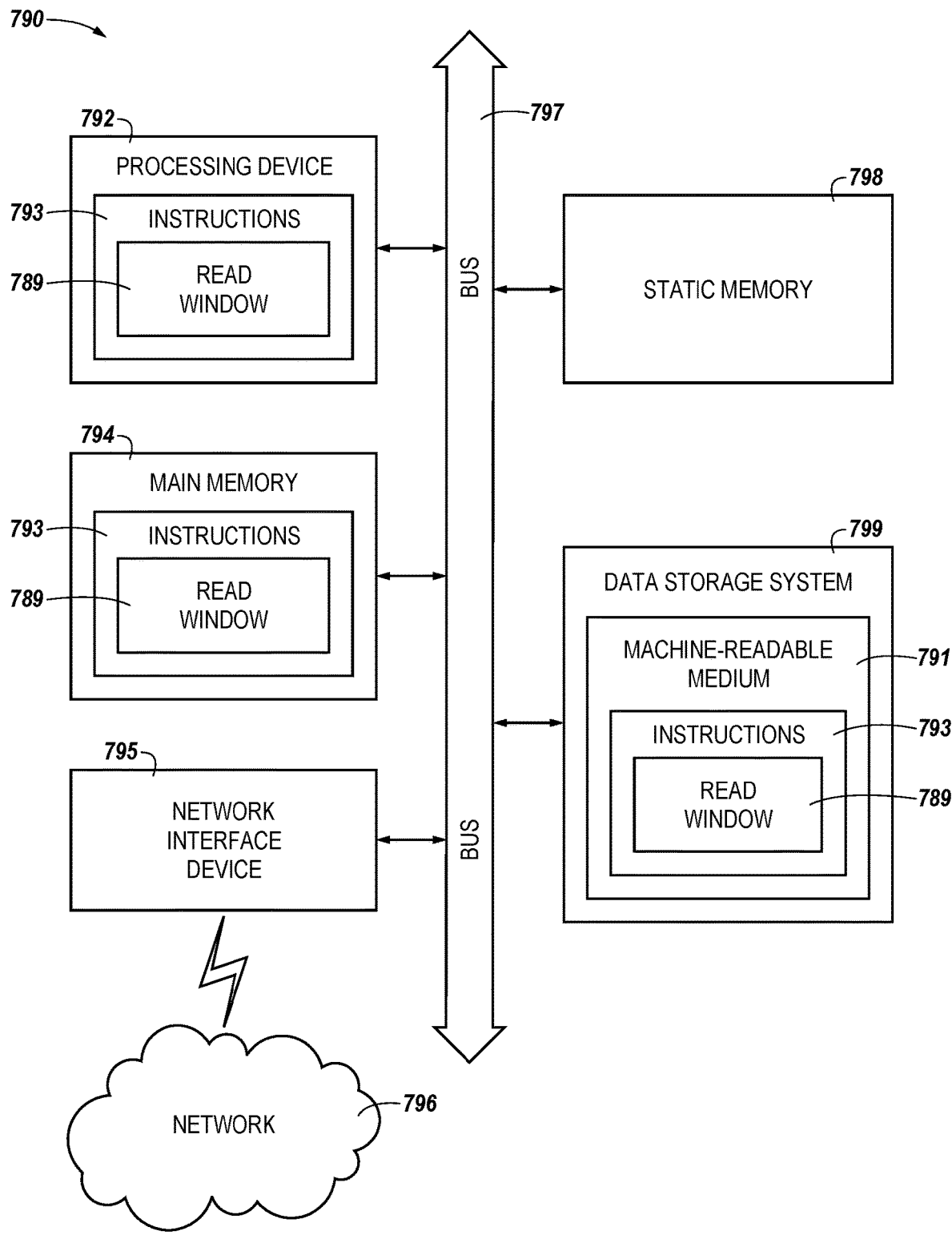
FIG. 7 is a block diagram of an example computer system in which embodiments of the present disclosure can operate.

FIG. 7 is a block diagram of an example computer system in which embodiments of the present disclosure can operate. Within the computer system 790, a set of instructions, for causing a machine to perform one or more of the methodologies discussed herein, can be executed. The computer system 790 includes a processing device 792, a main memory 794, a static memory 798 (e.g., flash memory, static random access memory (SRAM), etc.), and a data storage system 799, which communicate with each other via a bus 797. The data storage system 799 is analogous to the memory sub-system 104 illustrated in FIG. 1.

The processing device 792 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 792 can also be one or more special-purpose processing devices such as an ASIC, an FPGA, a digital signal processor (DSP), network processor, or the like. The processing device 792 is configured to execute instructions 793 for performing the operations and steps discussed herein. The computer system 790 can further include a network interface device 795 to communicate over a network 796.

The data storage system 799 can include a machine-readable storage medium 791 (also known as a computer-readable medium) on which is stored one or more sets of instructions 793 or software embodying one or more of the methodologies or functions described herein. The instructions 793 can also reside, completely or at least partially, within the main memory 794 and/or within the processing device 792 during execution thereof by the computer system 790, the main memory 794 and the processing device 792 also constituting machine-readable storage media.

In some embodiments, the instructions 793 can be executed to implement functionality corresponding to the read window circuitry 112 of FIG. 1. The instructions 793 can be executed to subject a group of memory cells of a memory device to PECs at an accelerated rate relative to a rate of PECs associated with programming operations of the memory device. For example, memory cells can be subjected to PECs at a rate 10, 11, 12, or 13, even 100, times faster than a rate of PECs associated with operation of a memory device. The instructions 793 can be executed to extrapolate an initial target voltage corresponding to a programmed state of a different group of memory cells of the memory device to achieve a desired data retention capability.

In some embodiments, the instructions 793 can be executed to subject the group of memory cells to a particular quantity of PECs during a period of time and subject the different group of memory cells to the particular quantity of PECs during a longer period of time in association with a plurality of programming operations. The instructions 793 can be executed to determine a decrease of a read window of the group of memory cells resultant from subjecting the memory cells to PECs at the accelerated rate. The initial target voltage of the different group of memory cells can be extrapolated based on the determined decrease in the read window. A read window of the different group of memory cells can be increased to compensate for the determined decrease of the read window.

While the machine-readable storage medium 791 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, ROMs, RAMs, EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    subjecting a group of memory cells of a memory device to a particular quantity of program/erase cycles (PECs) representative of a desired operating characteristic of the memory device and a desired service life of the memory device; and
    subsequent to subjecting the group of memory cells to the particular quantity of PECs, assessing a data retention capability of the group of memory cells.

2. The method of claim 1, wherein assessing the data retention capability comprises determining a read window of the group of memory cells.

3. The method of claim 2, further comprising determining an initial read window for a different group of memory cells of the memory device based, at least in part, on the determined read window of the group of memory cells.

4. The method of claim 3, further comprising performing a program operation on the different group of memory cells using the initial read window.

5. The method of claim 1, wherein the particular quantity of PEC to which the group of memory cells are subjected is representative of a desired data retention capability of a different group of memory cells of the memory device after undergoing the particular quantity of PECs.

6. A system, comprising:
    a processing device; and
    a memory device couplable to the processing device,
    wherein the processing device is configured to:
        subject a first group of memory cells of the memory device to a plurality of program/erase cycles (PECs), wherein a quantity of the plurality of PECs is based at least in part on a quantity of programming operations undergone by a second group of memory cells of the memory device;
        determine, subsequent to subjection of the first group of memory cells to the plurality of PECs, an operating characteristic of the first group of memory cells; and
        adjust a read window for subsequent programming operations performed on the second group of memory cells based on the performance characteristic.

7. The system of claim 6, wherein the processing device is to cause a target voltage corresponding to a data state to be adjusted to adjust the read window.

8. The system of claim 6, wherein the processing device is configured to perform a programming operation using a third group of memory cells of the memory device using the adjusted read window.

9. The system of claim 6, wherein the processing device is configured to determine the performance characteristic of the first group of memory cells after greater than threshold period of time after completion of subjecting the first group of memory cells to the plurality of PECs.

10. The system of claim 6, wherein the processing device is configured to extrapolate a rate of change of a read window of the first group of memory cells with respect to the plurality of PECs.

11. The system of claim 6, wherein the processing device is configured to, responsive to completion of subjecting the first group of memory cells to the plurality of PECs, cause the first group of memory cells to be released for data storage.

12. The system of claim 11, wherein the plurality of PECs are not associated with the data storage.

13. An apparatus, comprising:
    a cyclic buffer portion;
    a snapshot portion comprising:
        a first group of memory cells; and
        a second group of memory cells; and
    control circuitry coupled to the cyclic buffer portion and the snapshot portion, wherein the control circuitry is configured to:
        subject the first group of memory cells to a plurality of program/erase cycles (PECs) at an accelerated rate relative to a rate of PECs associated with programming the second group of memory cells; and
        program the second group of memory cells using an initial target voltage corresponding to a particular data retention capability based on the plurality of PECs.

14. The apparatus of claim 13, wherein the control circuitry is further configured to:
   subject the first group of memory cells to a particular quantity of PECs during a first period of time; and
   subject the second group of memory cells to the particular quantity of PECs during a second period of time in association with a plurality of programming operations.

15. The apparatus of claim 13, wherein the control circuitry is further configured to determine a change of a read window of the first group of memory cells based, at least in part, from subjecting the first group of memory cells to the plurality of PECs at the accelerated rate.

16. The apparatus of claim 15, wherein the control circuitry is further configured to extrapolate the initial target voltage of the second group of memory cells based at least in part on the determined change of the read window of the first group of memory cells.

17. The apparatus of claim 15, wherein the control circuitry is further configured to adjust a read window of the second group of memory cells to compensate for the determined change of the read window of the first group of memory cells.

18. A system, comprising:
a processing device; and
a memory device couplable to the processing device and comprising:
   a cyclic buffer portion; and
   a snapshot portion comprising:
      a first group of memory cells; and
      a second group of memory cells,
wherein the processing device is configured to:
   subject a first group of memory cells of the memory device to a plurality of program/erase cycles (PECs), wherein a quantity of the plurality of PECs is based at least in part on a quantity of programming operations undergone by a second group of memory cells of the memory device; and
   determine, subsequent to subjection of the first group of memory cells to the plurality of PECs, an operating characteristic of the first group of memory cells.

* * * * *